US00RE47544E

(19) United States
(12) Reissued Patent
Kim et al.

(10) Patent Number: US RE47,544 E
(45) Date of Reissued Patent: Jul. 30, 2019

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Hwa Kyung Kim, Gyeonggi-do (KR); Byung Chul Ahn, Seoul (KR); Chang Wook Han, Seoul (KR); Woo Jin Nam, Gyeonggi-do (KR); Hong Seok Choi, Seoul (KR); Yoon Heung Tak, Gyeonggi-do (KR); Shinji Takasugi, Gyeonggi-do (KR)

(73) Assignee: LG Display Co., Ltd., Seoul (KR)

(21) Appl. No.: 15/199,247

(22) Filed: Jun. 30, 2016

Related U.S. Patent Documents

Reissue of:
(64) Patent No.: 8,766,292
Issued: Jul. 1, 2014
Appl. No.: 13/706,572
Filed: Dec. 6, 2012

(30) Foreign Application Priority Data

Dec. 21, 2011 (KR) ..... 10-2011-0139620

(51) Int. Cl.
*H01L 27/32* (2006.01)
*H01L 51/52* (2006.01)
*H01L 51/56* (2006.01)

(52) U.S. Cl.
CPC ..... *H01L 27/3216* (2013.01); *H01L 51/52* (2013.01); *H01L 51/56* (2013.01); *H01L 27/3213* (2013.01)

(58) Field of Classification Search
None
See application file for complete search history.

(56) References Cited

U.S. PATENT DOCUMENTS 6,919,681 B2 * 7/2005 Cok ..... G09G 3/3216 313/500
7,161,566 B2 * 1/2007 Cok et al. ..... 345/76
(Continued)

FOREIGN PATENT DOCUMENTS

JP 2006189475 A 7/2006
KR 20020027932 A 4/2002
(Continued)

OTHER PUBLICATIONS

Chinese Office Action dated Aug. 5, 2014 for corresponding Chinese patent application No. 201210548066.5.
(Continued)

*Primary Examiner* — Sean E Vincent
(74) *Attorney, Agent, or Firm* — Morgan, Lewis & Bockius LLP

(57) ABSTRACT

Provided are a method of manufacturing an organic light emitting display device and an organic light emitting display device manufactured by the method. The method includes calculating a peak-luminance current density for each of a red sub-pixel, a blue sub-pixel, a green sub-pixel, and a white sub-pixel, calculating an average use current density for each of the red sub-pixel, blue sub-pixel, green sub-pixel, and white sub-pixel; determining a size of each sub-pixel with the peak-luminance current density and the average use current density, and forming the sub-pixels with the determined sizes of the respective sub-pixels. The present invention sets the size of each sub-pixel in consideration of a peak-luminance current density and an average use current
(Continued)

density, thus easily achieving the peak luminance and enhancing the color-coordinate life.

21 Claims, 12 Drawing Sheets

(56) References Cited

U.S. PATENT DOCUMENTS

| | | | | |
|---|---|---|---|---|
| 7,230,594 | B2 * | 6/2007 | Miller | G09G 3/3216 315/169.1 |
| 7,256,855 | B2 * | 8/2007 | Baek | 349/144 |
| 7,382,384 | B2 * | 6/2008 | Winters | G09G 3/3225 345/694 |
| 7,443,093 | B2 * | 10/2008 | Jianpu | H01L 27/3213 313/500 |
| 7,883,386 | B2 * | 2/2011 | Ho | H01L 27/3213 313/500 |
| 7,948,506 | B2 * | 5/2011 | Cok | G09G 3/2003 345/694 |
| 7,986,291 | B2 * | 7/2011 | Van Mourik et al. | 348/88 |
| 8,044,980 | B2 * | 10/2011 | Shimodaira | 345/690 |
| 8,115,216 | B2 * | 2/2012 | Smith | H01L 27/3218 257/88 |
| 8,159,426 | B2 * | 4/2012 | Chang | G09G 3/3208 313/463 |
| 8,159,508 | B2 * | 4/2012 | Lee | H01L 27/3218 313/582 |
| 2004/0164935 | A1 * | 8/2004 | Dedene et al. | 345/75.2 |
| 2004/0201558 | A1 | 10/2004 | Arnold et al. | |
| 2005/0139834 | A1 | 6/2005 | Park et al. | |
| 2005/0225574 | A1 * | 10/2005 | Brown Elliott | G02F 1/133514 345/694 |
| 2006/0152531 | A1 | 7/2006 | Lin et al. | |
| 2006/0221092 | A1 | 10/2006 | Noguchi et al. | |
| 2006/0256257 | A1 * | 11/2006 | Nakano et al. | 349/80 |
| 2006/0261732 | A1 | 11/2006 | Miller et al. | |
| 2007/0115221 | A1 | 5/2007 | Buchhauser et al. | |
| 2007/0164664 | A1 | 7/2007 | Ludwicki et al. | |
| 2008/0002070 | A1 * | 1/2008 | Cok | 348/801 |
| 2008/0007492 | A1 | 1/2008 | Koh et al. | |
| 2009/0212694 | A1 * | 8/2009 | Cok | 313/506 |
| 2010/0128202 | A1 * | 5/2010 | Chu Ke et al. | 349/69 |
| 2011/0157250 | A1 * | 6/2011 | Hasegawa | 345/690 |
| 2011/0181631 | A1 * | 7/2011 | Shishido et al. | 345/690 |

FOREIGN PATENT DOCUMENTS

| | | | |
|---|---|---|---|
| KR | 20050069312 | A | 7/2005 |
| KR | 100579171 | B1 | 5/2006 |
| KR | 100579549 | B1 | 5/2006 |
| KR | 20060106757 | A | 10/2006 |

OTHER PUBLICATIONS

Chinese Office Action dated Apr. 13, 2015 for corresponding Chinese patent application No. 201210548066.5.

Communication from the European Patent Office dated Mar. 7, 2016 for corresponding EPO patent application No. 12 008 086.6-1552.

EPO Communication dated Apr. 3, 2013 transmitting extended European Search Report for corresponding EPO Application No. 1200808.6.

EPO Communication dated Aug. 19, 2014 regarding corresponding EPO Application No. 12008086.5.

Korean Patent office communication dated Oct. 8, 2012 regarding corresponding Korean Application No. 10-2011-0139620.

Korean Patent office communication dated Jun. 4, 2012 regarding corresponding Korean Application No. 10-2011-0139620.

Li, J. et al., "White polymer light emitting diodes with multi-layer device structure," Synthetic metals, Elsevier Sequoia, Lausanne, CH, vol. 159. No. 1-2, Jan. 1, 2009, p. 36-40, XP025910838, ISSN: 0379-6779, DOI: 10.1016/J. Synthmet.2008.07.010.

Communication from the European Patent Office dated Mar. 27, 2018 regarding a counterpart European patent application No. EP 12 008 086.6.

Lee, B., et. al. "TFT-LCD with RGBW Color System", SID 03 Digest (2003) pp. 1212-1215.*

Spindler, J., et. al. "System Considerations for RGBW OLED Displays"J. of SID 14/1 (2006), pp. 37-48.*

Wei, B., et. al. "High peak luminance of molecularly dye-doped organic light-emitting diodes under intense voltage pulses", J. Appl. Phys. 98, (2005) p. 044506-5.*

* cited by examiner

FIG. 20

| | | R | | | G | | | B | | | W | | |
|---|---|---|---|---|---|---|---|---|---|---|---|---|---|
| SUB-PIXEL AREA RATIO (R:G:B:W) | | EFFICIENCY (Cd/A) | x | y | EFFICIENCY (Cd/A) | x | y | EFFICIENCY (Cd/A) | x | y | EFFICIENCY (Cd/A) | x | y |
| | | 5.94 | 0.657 | 0.332 | 29.2 | 0.296 | 0.625 | 2.97 | 0.142 | 0.060 | 70.2 | 0.323 | 0.358 |
| AVERAGE CURRENT DENSITY (mA/cm2) | 28.5 : 28.5 : 45.0 : 34.2 | 1.438 | | | 0.601 | | | 1.726 | | | 1.695 | | |
| | 35:35:35:35 | 1.171 | | | 0.49 | | | 2.219 | | | 1.656 | | |
| | 45.5 : 38.5 : 39.8 : 16.3 | 0.901 | | | 0.445 | | | 1.951 | | | 3.557 | | |
| | 40.0 : 35.0 : 35.0 : 30.0 | 1.025 | | | 0.49 | | | 2.219 | | | 1.933 | | |

ORGANIC LIGHT EMITTING DISPLAY DEVICE AND METHOD OF MANUFACTURING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application claims the benefit of the Korean Patent Application No. 10-2011-0139620 filed on Dec. 21, 2011, which is hereby incorporated by reference as if fully set forth herein.

BACKGROUND

1. Field of the Invention

The present invention relates to an organic light emitting display device using organic light emitting diodes (OLEDs) and a method of manufacturing the same.

2. Discussion of the Related Art

Recently, with the advancement of multimedia, the importance of flat panel display (FPD) devices is increasing. Therefore, various FPD devices such as liquid crystal display (LCD) devices, plasma display panel (PDP) devices, field emission display (FED) devices, and organic light emitting display devices are being used practically. In such FPD devices, the organic light emitting display devices have a fast response time of 1 ms or less and low power consumption, and have no limitation in a viewing angle because the organic light emitting display devices self-emit light. Accordingly, the organic light emitting display devices are attracting much attention as next generation FPD devices.

A related art organic light emitting display device includes a plurality of pixels that are respectively formed in a plurality of pixel areas defined by intersections between a plurality of gate lines and a plurality of data lines, and each of the pixels includes a red sub-pixel, a green sub-pixel, and a blue sub-pixel. The related art organic light emitting display device combines red light, green light, and blue light emitted from the respective sub-pixels to realize a certain color in units of a pixel, thereby displaying an image.

FIG. 1 is a diagram illustrating sub-pixels of a related art organic light emitting display device.

As seen in FIG. 1, the related art organic light emitting display device 10 includes a red sub-pixel 11, a blue sub-pixel 13, and a green sub-pixel 15.

According to the organic light emitting display device 10, in a sub-pixel which is the most used based on the frequency of use and an accumulated use time for each sub-pixel, a current density increases compared to the other sub-pixels, and thus, deterioration is rapidly made, thereby shortening the service life of a corresponding sub-pixel. As a result, a time for which the color coordinates of the organic light emitting display device 10 are changed is shortened, and thus, a color-coordinate life is shortened.

To overcome such limitations, a method has been proposed in which, by enlarging the size of a sub-pixel (for example, the blue sub-pixel 13) having the high frequency of use and an accumulated much use time compared to the other sub-pixels 11 and 15, the current density of the blue sub-pixel 13 is lowered, and thus, the service lives of the sub-pixels 11, 13 and 15 become equal, thereby extending the color-coordinate life of the organic light emitting display device 10.

However, as described above, when the size of a blue sub-pixel is enlarged in order for the service lives of sub-pixels to become similar, it is impossible to realize the peak luminance of a pure color of each of the other sub-pixels.

SUMMARY

Accordingly, the present invention is directed to an organic light emitting display device using organic light emitting diodes (OLEDs) and a method of manufacturing the same that substantially obviate one or more problems due to limitations and disadvantages of the related art.

An aspect of the present invention is directed to an organic light emitting display device with the consideration of both peak luminance and a color-coordinate life, and a method of manufacturing the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a method of manufacturing an organic light emitting display device including: calculating a peak-luminance current density for each of a red sub-pixel, a blue sub-pixel, a green sub-pixel, and a white sub-pixel; calculating an average use current density for each of the red sub-pixel, blue sub-pixel, green sub-pixel, and white sub-pixel; determining a size of each sub-pixel with the peak-luminance current density and the average use current density; and forming the sub-pixels with the determined sizes of the respective sub-pixels.

In another aspect of the present invention, there is provided an organic light emitting display device including: a red sub-pixel, a blue sub-pixel, a green sub-pixel, and a white sub-pixel formed on a substrate, wherein each of the sub-pixels is formed in the calculated size thereof with the calculated peak-luminance current density and the calculated average use current density.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 20 is a graph showing a comparison result of current densities based on an area ratio of sub-pixels which are described in FIGS. 8 to 19.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

In description of embodiments of the present invention, when a structure is described as being formed at an upper portion/lower portion of another structure or on/under the other structure, this description should be construed as including a case where the structures contact each other and moreover a case where a third structure is disposed therebetween.

Figure 1:
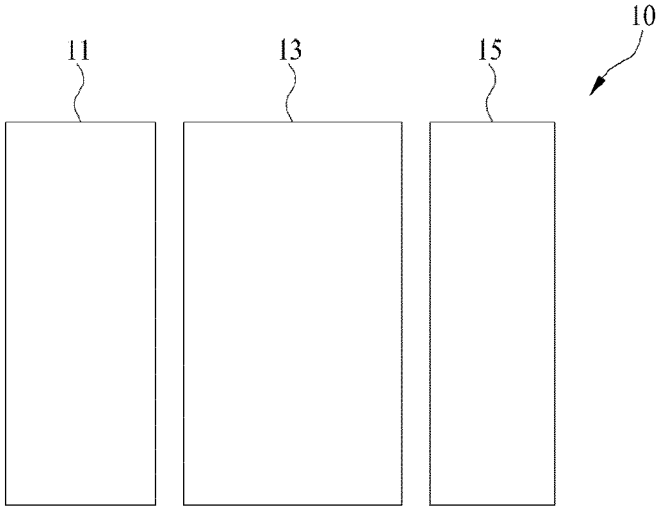
FIG. 1 [ Related Art ]
FIG. 1 is a diagram illustrating sub-pixels of a related art organic light emitting display device.
Figure 2:
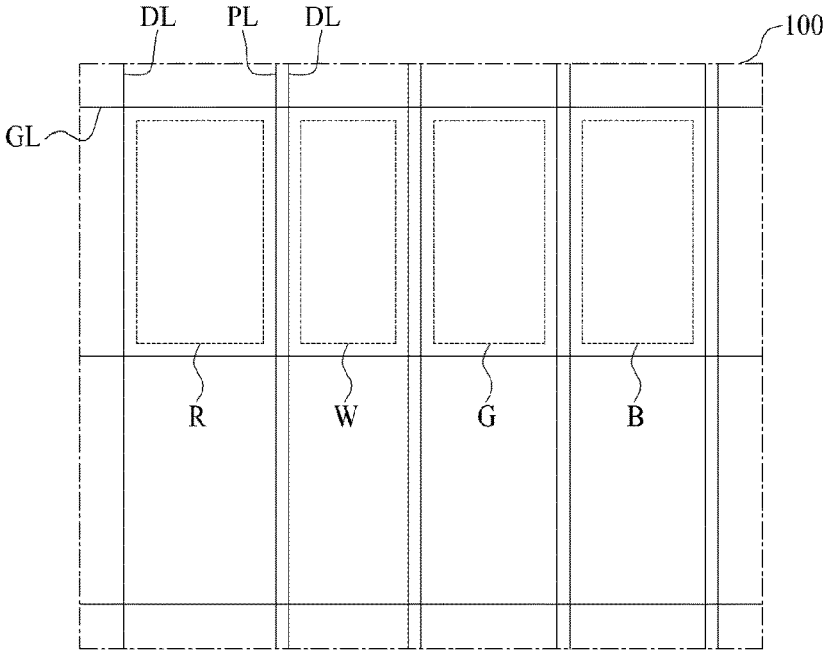
FIG. 2 is a diagram illustrating a schematic structure of an organic light emitting display device according to an embodiment of the present invention.

FIG. 2 is a diagram illustrating a schematic structure of an organic light emitting display device according to an embodiment of the present invention.

As seen in FIG. 2, the organic light emitting display device according to an embodiment of the present invention includes a gate lines GL, a data line DL, a power line PL, a red sub-pixel R, a white sub-pixel W, a green sub-pixel G, and a blue sub-pixel B.

The gate line GL is formed to be extended in a first direction, on a substrate. The data line DL is formed to intersect the gate line GL and to be extended in a second direction, on the substrate. The power line PL may be formed apart from and in parallel to the data line DL.

A plurality of the gate lines GL and a plurality of the data lines DL are cross-arranged to define the red sub-pixel R, the white sub-pixel W, the green sub-pixel G, and the blue sub-pixel B.

A thin film transistor (TFT) and an OLED are formed in each of a plurality of sub-pixel areas.

The TFT includes a switching TFT and a driving TFT. The switching TFT is connected to the gate line GL and the data line DL, and receives a gate signal and a data signal. One end of the switching TFT is connected to the driving TFT. The TFT driving transistor is connected to the power line PD and the OLED.

The OLED is formed on the TFT, and includes a cathode electrode, an organic light emitting layer, and an anode electrode. The organic light emitting layer includes an electron injection layer (EIL), an electron transport layer (ETL), an emission layer (EML), a hole transport layer (HTL), and a hole injection layer (HIL), and has a structure in which the layers are stacked in a multilayer.

When a driving voltage is applied to the anode electrode and the cathode electrode, a hole passing through the HTL and an electron passing through the ETL move to the EML to generate an exciton, and thus, the EML emits visible light.

In an embodiment of the organic light emitting display device according to the present invention, the OLED is formed as a white OLED (WOLED). Therefore, a color filter that converts white light, emitted from the WOLED, into red light, green light, or blue light is formed such that the red sub-pixel R, the white sub-pixel W, the green sub-pixel G, and the blue sub-pixel B express respective colors. In this case, the color filter may not be formed in an area in which the white sub-pixel is disposed.

The combination of the red sub-pixel R, the white sub-pixel W, the green sub-pixel G, and the blue sub-pixel B forms a unit pixel to express various colors.

Figure 3:
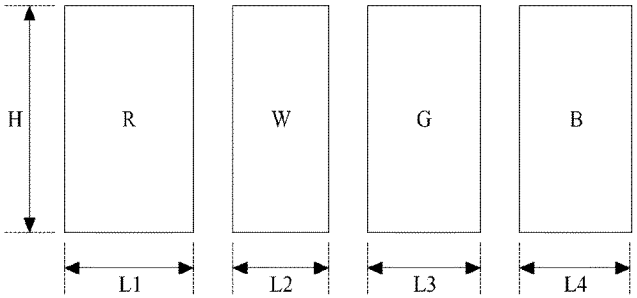
FIG. 3 is a diagram illustrating the area of each sub-pixel of an organic light emitting display device according to an embodiment of the present invention.

FIG. 3 is a diagram illustrating the area of each sub-pixel of an organic light emitting display device according to an embodiment of the present invention.

As seen in FIG. 3, in the organic light emitting display device according to an embodiment of the present invention, the sub-pixels are designed to have different areas.

In one scheme that differently designs the areas of the sub-pixels, the red sub-pixel R, the white sub-pixel W, the green sub-pixel G, and the blue sub-pixel B may have the same height H, and respective lengths L1 to L4 of the sub-pixels may be differently changed, specifically, the respective lengths L1 to L4 of the sub-pixels may differ. In this case, by only adjusting a interval between the data lines DL, the respective areas of the sub-pixels are differently changed. However, the present invention is not limited thereto. As another example, the respective heights H of the sub-pixels may be differently set, and may be differently designed by various schemes.

According to an embodiment of the present invention, in designing the areas of the red, white, green, and blue sub-pixels, the peak-luminance current density of each of the sub-pixels and the average use current density of each sub-pixel are considered.

The peak luminance denotes the maximum luminance that is shown at a color temperature reference satisfying the design spec of the organic light emitting display device. In an RGB structure, when realizing the peak luminance, the peak luminance is achieved by a combination satisfying a color temperature of a product by pure color of red, green, and blue. In a WRGB structure, there are two methods, which include a method that realizes the peak luminance with the red, green, blue, and white sub-pixels and a method that realizes the peak luminance by using only the red, green, and blue sub-pixels with no white sub-pixel. In all of the two methods, only when it is possible to realize the peak luminance, image quality equal to the image-quality level of the RGB structure is realized in expressing a pure color.

A color filter is generally used for realizing red, green, and blue with the WOLED, in which case the efficiency of red, green, and blue light passing through the color filter is reduced to less than the efficiency of the WOLED. Therefore, in the WRGB structure, a high current needs to flow in each of the red, green, and blue sub-pixels for realizing the peak luminance with only the green, and blue sub-pixels, and thus, the current density of each of the green, and blue sub-pixels increases.

To design the area of each sub-pixel in consideration of the peak-luminance current density and average use current density of each sub-pixel, the peak luminance current density of each sub-pixel is calculated, and a sub-pixel having a high peak-luminance current density is relatively greater designed, thereby enabling the peak luminance of each sub-pixel to be achieved more easily. Also, by calculating the average use current density of each sub-pixel and relatively greater designing a sub-pixel having a high average use current density, a deterioration speed difference between the sub-pixels is minimized, and thus, a color-coordinate life is extended.

As a result, the optimal area of each sub-pixel is designed in consideration of both the peak-luminance current density and the average use current density of each sub-pixel, and thus, a peak luminance achievement rate of each sub-pixel increases and a deterioration speed difference between the sub-pixels is minimized.

First, the reason and method that calculates the peak-luminance current density of each sub-pixel and relatively greater designs a sub-pixel having a high peak-luminance current density will now be described.

The peak luminance, as described above, denotes the maximum luminance value that is predetermined in the organic light emitting display device. When the peak luminance is set, each sub-pixel is formed to realize peak luminance for each color. To realize the peak luminance in this way, a current density necessary for each of the red, green, blue, and white sub-pixels is defined as a peak-luminance current density.

Performing comparison based on the same pixel area, the WRGB sub-pixel structure that further includes a white sub-pixel compared to the RGB sub-pixel structure is relatively reduced in area of each of RGB sub-pixels thereof.

Therefore, to show the peak luminance of the same pure color as that of the RGB sub-pixel structure, the WRGB sub-pixel structure needs to increase the current density of each of the red, green, and blue sub-pixels. Especially, some and all of the sub-pixels have different peak-luminance current densities, and, in an embodiment of the present invention, the area of a sub-pixel requiring the highest peak-luminance current density is formed greater than those of the other sub-pixels.

As a result, by enlarging the area of a sub-pixel requiring the highest peak-luminance current density, the peak luminance can be achieved even though the current density of the sub-pixel is relatively lowered.

Hereinafter, a method according to an embodiment that sets a peak-luminance current density for achieving the peak luminance for each sub-pixel will be described with reference to FIG. 4.

Figure 4:
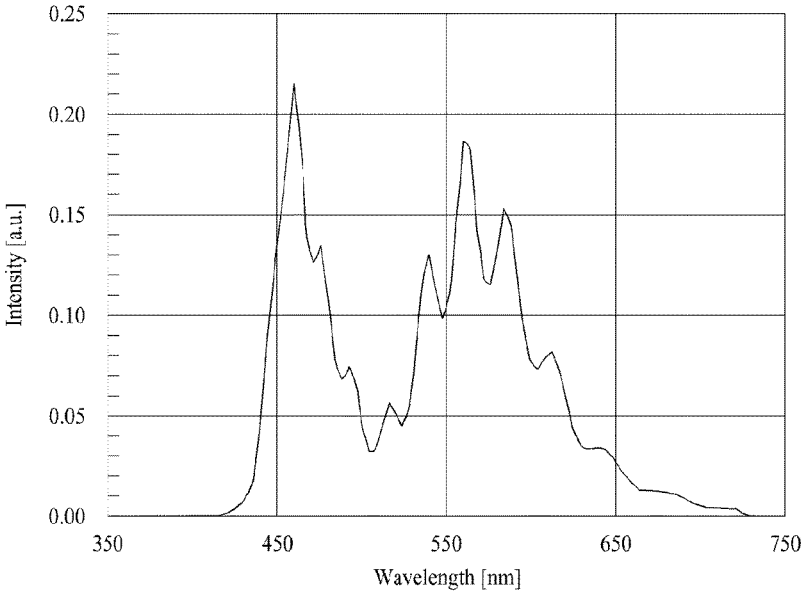
FIG. 4 is a diagram showing spectrum characteristic of an organic light emitting display device according to an embodiment of the present invention.

FIG. 4 is a diagram showing spectrum characteristic of an organic light emitting display device according to an embodiment of the present invention.

As seen in FIG. 4, it can be seen that the organic light emitting display device according to an embodiment of the present invention includes a 2-peak WOLED, and particularly, intensity near a wavelength of about 650 nm displaying red is relatively low.

As seen in the spectrum characteristic of an OLED in which the intensity of red is low, in the red sub-pixel, it is required to set the highest peak-luminance current density for achieving the peak luminance. In this case, therefore, the area of the red sub-pixel may be formed greater than those of the other sub-pixels so as to more easily achieve the peak luminance.

On the other hand, in the white sub-pixel, since the white sub-pixel uses an entire wavelength range of visible light, the lowest peak-luminance current density may be set for achieving the peak luminance. In this case, therefore, the area of the white sub-pixel may be formed greater than those of the other sub-pixels.

In this way, the peak-luminance current density may be set in consideration of the spectrum characteristic of the OLED, and, when the 2-peak WOLED of FIG. 4 is applied, the area of the red sub-pixel may be relatively greater formed. However, when the spectrum characteristic of the OLED is changed, the area of a sub-pixel other than the red sub-pixel may be relatively greater formed.

Next, the reason and method that calculates the average use current density of each sub-pixel and relatively greater designs a sub-pixel having a high average use current density will now be described.

As the OLED is used, the OLED is deteriorated, and thus, a sub-pixel emits light having color coordinates different from the original color coordinates thereof. For this reason, a time taken until reaching a predetermined color-coordinate threshold change amount is measured and defined as the color-coordinate life of the OLED.

A color-coordinate life is construed using the amount of changed color coordinates (hereinafter referred to as a color-coordinate change amount).

The color-coordinate change amount is defined as a color-coordinate difference between initial color coordinates (u'0, v'0) and color coordinates (u't, v't) after a certain time "t" elapses, according to the Commission Internationale de l'Eclairage (CIE) 1931 standard colorimetric system (u', v'). The color-coordinate change amount is expressed as Equation (1).

$$\text{color-coordinate change amount}=[(u'_t-u'_0)^2+(v'_t-v'_0)^2]^{1/2} \quad (1)$$

As the color-coordinate change amount increases, a time taken until reaching the predetermined color-coordinate threshold change amount becomes shorter. Accordingly, as a color-coordinate life becomes shorter and a color-coordinate change amount becomes lower, the color-coordinate life may be construed as being long.

As a factor affecting the color-coordinate life, there is an average use current density based on an accumulated use time and the frequency of use of a sub-pixel. That is, when a sub-pixel is used for a long time at a high current density, the color-coordinate life of an OLED is shortened. Accordingly, by appropriately designing an average use current density, the color-coordinate life is extended.

Here, the average use current density is defined as current density that is averagely required according to an accumulated use time and the frequency of use of each sub-pixel, in reproducing general images.

When the average use current density of each sub-pixel is measured by reproducing general images, it can be seen that a sub-pixel having the highest average use current density is a blue sub-pixel, a sub-pixel having the second highest average use current density is a white sub-pixel, and red and green sub-pixels have the third highest average use current density.

Accordingly, in the present invention, the area of the blue sub-pixel having the highest average use current density is formed greater than those of the other sub-pixels. As the area of the blue sub-pixel having the highest average use current density increases, the average use current density becomes lower, and thus, the color-coordinate life of the blue sub-pixel is enhanced.

Image sticking occurs in an initial driving stage of the organic light emitting display device. Image sticking denotes that a specific image is stuck and shown due to a sub-pixel whose a service life has been intensively shortened, in driving a panel. Image sticking has correlation with the area, color-coordinate life, and image-sticking life of each sub-pixel. A method of decreasing image sticking is matched with a condition that maximizes the color-coordinate life. Therefore, in an operation of determining the area of a sub-pixel, when a color-coordinate life is considered, an image-sticking life is not separately considered. However, depending on the case, the image-sticking life may be considered in an operation of determining the area of a sub-pixel.

The image-sticking life is defined as a time taken until an average luminance reduction ratio becomes a certain ratio, and the certain ratio may be set to 5%. RGBW sub-pixels have different luminance reduction ratios, and thus, the average luminance reduction ratio of each sub-pixel is used in analyzing image sticking.

Here, the multiplication of the luminance ratio and luminance reduction ratio of each sub-pixel is calculated, the average luminance reduction ratio is defined as the sum of the multiplications for the respective sub-pixels.

The present invention enhances the color-coordinate life, and thereby improves the image-sticking life, thus decreasing image sticking.

As described above, the peak-luminance current density of each sub-pixel is calculated, and the area of a sub-pixel having a high peak-luminance current density is relatively greater set. Also, the average use current density of each sub-pixel is calculated, and the area of a sub-pixel having a high average use current density is relatively greater set. In overall consideration of the two factors, the area of each sub-pixel may be designed.

Therefore, depending on the case, even though a specific sub-pixel has the highest peak-luminance current density, the area of the specific sub-pixel may be set relatively less than those of the other sub-pixels in the optimally designed state. Similarly, even though a specific sub-pixel has the highest average use current density, the area of the specific sub-pixel may be set relatively less than those of the other sub-pixels in the optimally designed state.

Referring again to FIG. 3, according to an embodiment of the present invention, the width L1 of the red sub-pixel, the width L2 of the white sub-pixel, the width L3 of the green sub-pixel, and the width L4 of the blue sub-pixel are designed to meet a condition of "L1>L4≥L3>L2".

That is, the area of the red sub-pixel is the greatest, the area of the white sub-pixel is the least, and the area of the blue sub-pixel is equal to or greater than that of the green sub-pixel.

In more detail, the area of the red sub-pixel may be 1.25 to 1.5 times that of the white sub-pixel. Also, the area of the blue sub-pixel may be 1.25 or less times that of the white sub-pixel. Also, the area of the green sub-pixel may be 1.25 or less times that of the white sub-pixel.

In an embodiment when the sub-pixels are designed under the conditions, an area ratio of the red, blue, green, and white sub-pixels may be 40:35:35:30.

The sub-pixels may be arranged in a stripe type. In this case, the arrangement order of the sub-pixels may be set as the order of the red, blue, green, and white sub-pixels. Also, a sub-pixel in which a high current flows and a sub-pixel in which a low current flows may be designed to share a Vdd line.

The reason is because the drop of a voltage (IR drop) is caused by a local current difference of a power line because a high current flows in the blue and white sub-pixels, and decreases the overall luminance uniformity of the organic light emitting display device, causing the reduction in reliability of the organic light emitting display device. Also, the reason is because a local temperature difference occurs due to a current difference.

Accordingly, the blue and white sub-pixels in which the highest current flows are arranged apart from each other, and thus, the overall luminance uniformity of the organic light emitting display device is enhanced. Therefore, a temperature difference becomes uniform, and reliability is enhanced.

In a type in which the sub-pixels are arranged, there is a quad type in which the sub-pixels are arranged in a checkered shape, in addition to the stripe type. However, the arrangement type of the sub-pixels is not limited to the stripe type.

Figure 5:
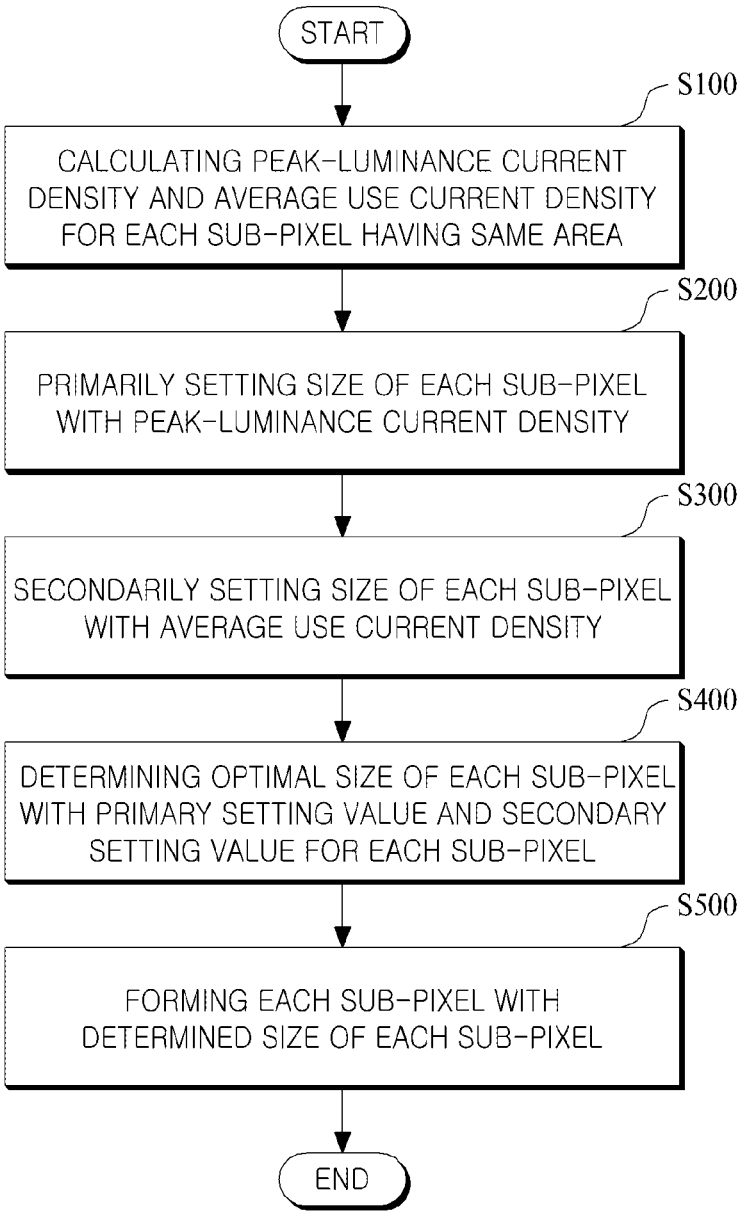
FIG. 5 is a diagram illustrating a method of manufacturing an organic light emitting display device according to an embodiment of the present invention.

FIG. 5 is a diagram illustrating a method of manufacturing an organic light emitting display device according to an embodiment of the present invention. The method of manufacturing the organic light emitting display device uses the above-described method that sets the sizes of the sub-pixels. In the following description, a repetitive description on the same elements as the above-described elements is not provided.

First, the peak-luminance current density and average use current density of each sub-pixel having the same area are calculated in operation S100.

The peak luminance current density, as described above, is calculated in consideration of the spectrum characteristic of an OLED, and more specifically, the spectrum characteristic of an organic light emitting layer.

The average use current density is calculated as a current density that is averagely required according to an accumulated use time and the frequency of use of each sub-pixel in reproducing general images.

Subsequently, the size of each sub-pixel is primarily set with the calculated peak luminance current density in operation S200. For example, in a 2-peak white organic light emitting layer, and thus, the size of the red sub-pixel is greatest set.

Subsequently, the size of each sub-pixel is secondarily set with the calculated average use current density in operation S300. For example, when the average use current density of each sub-pixel is measured by reproducing general images, a sub-pixel having the highest average use current density may be the blue sub-pixel.

There is no predetermined order between operation S200 (which primarily sets the size of each sub-pixel with the calculated peak luminance current density) and operation S300 that secondarily sets the size of each sub-pixel with the calculated average use current density. Therefore, after operation S300 that secondarily sets the size of each sub-pixel, operation S200 that primarily sets the size of each sub-pixel may be performed.

Subsequently, the optimal size of each sub-pixel is determined with the setting value (which has been calculated in the operation of primarily setting the size of each sub-pixel) and the setting value that has been calculated in the operation of secondarily setting the size of each sub-pixel, in operation S400.

That is, the optimal size of each sub-pixel is determined with the primarily set size of each sub-pixel and the secondarily set size of each sub-pixel.

In this case, an average use current density of a sub-pixel having the highest average use current density may be 6 or less times that of a sub-pixel having the lowest average use current density, and moreover, a peak-luminance design achievement degree of a sub-pixel having the highest peak-luminance design achievement degree may be 2 or less times that of a sub-pixel having the lowest peak-luminance design achievement degree, in which case a luminance deviation between the sub-pixels is reduced. Also, the color-coordinate life of the organic light emitting display device may be 20,000 hours or more.

Subsequently, each sub-pixel is formed according to the determined sub-pixel sizes in operation S500.

A process of forming each sub-pixel may include a process that forms a TFT array, a process that forms an OLED (including an organic light emitting layer formed on the TFT array) emitting white light, and a process that forms a color filter converting light, emitted from the OLED, into light having a certain color.

The process that forms the TFT array includes a process that forms the gate line GL, data line DL, and power line PL of FIG. 2, and a process that forms the switching TFT and the driving TFT in each sub-pixel area defined by the gate line GL and the data line DL.

The process of forming the OLED and the process of forming the color filter may be differently performed for the respective sub-pixels. Specifically, a process of forming the red sub-pixel may include the process of forming the OLED and a process of forming a red color filter, a process of forming the blue sub-pixel may include the process of forming the OLED and a process of forming a blue color filter, a process of forming the green sub-pixel may include the process of forming the OLED and a process of forming a green color filter, and a process of forming the white sub-pixel may include the process of forming the OLED.

The detailed structure of each sub-pixel may be the structure of FIGS. 6 and 7 to be described below.

Figure 6:
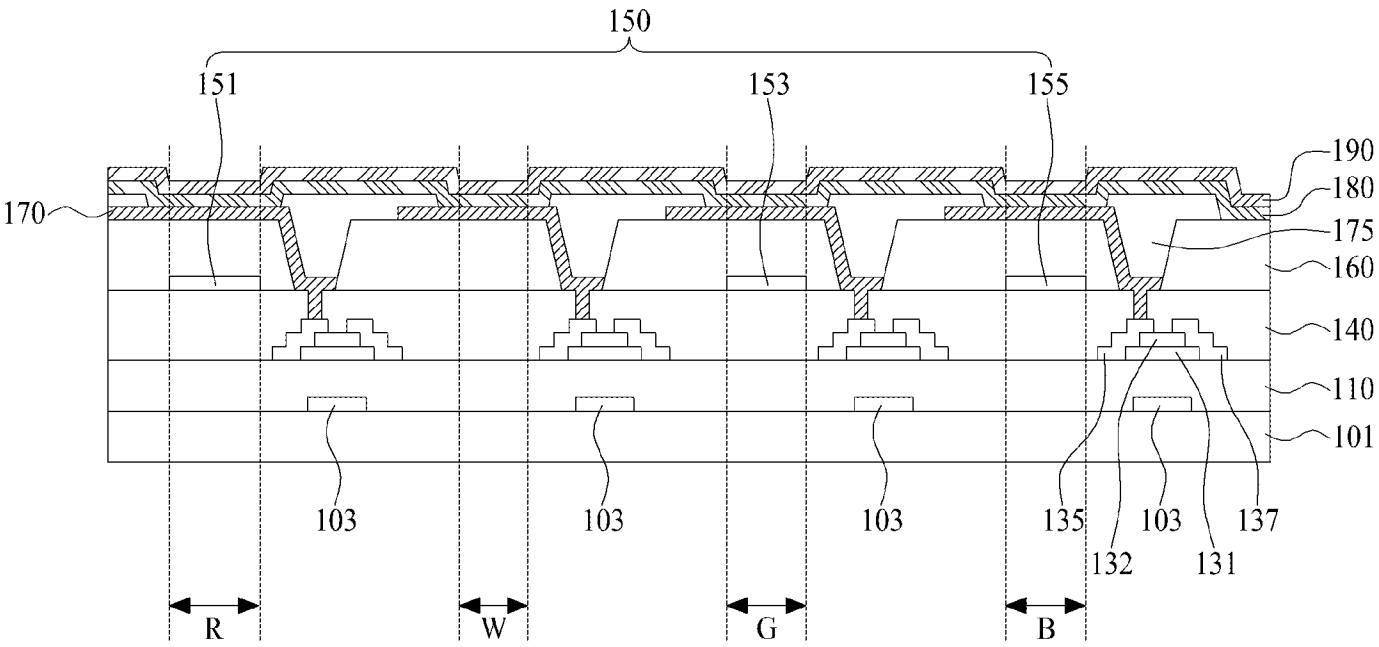
FIG. 6 is a sectional view illustrating an organic light emitting display device according to an embodiment of the present invention.

FIG. 6 is a sectional view illustrating an organic light emitting display device according to an embodiment of the present invention.

As seen in FIG. 6, the organic light emitting display device according to an embodiment of the present invention includes a substrate 101, a gate electrode 103, a gate insulator 110, a semiconductor layer 131, an etch stopper 132, a source electrode 135, a drain electrode 137, a first passivation layer 140, a color filter 150, a second passivation layer 160, an anode electrode 170, a bank layer 175, an organic light emitting layer 180, and a cathode electrode 190.

The substrate 101 may be formed of glass or transparent plastic.

The gate electrode 103 is formed on the substrate 101, and connected to the gate line GL. The gate electrode 103 may be a multilayer formed of one selected from the group consisting of Mo, Al, Cr, Au, Ti, Ni, Nd, and Cu, and an alloy thereof.

The gate insulator 110 is formed on the gate electrode 103, and may be silicon oxide (SiOx), silicon nitride (SiNx), or a multilayer thereof. However, the gate insulator 110 is not limited thereto.

The semiconductor layer 131 is formed on the gate insulator 110, and may include amorphous silicon or polycrystalline silicon in which the amorphous silicon is crystallized.

The etch stopper 132 may be formed on the semiconductor layer 131, and protect the semiconductor layer 131. However, the etch stopper 132 may not be provided depending on the case.

The source electrode 135 and the drain electrode 137 may be formed on the semiconductor layer 131. The source electrode 135 and the drain electrode 137 may be formed in a single layer or a multilayer. The source electrode 135 and the drain electrode 137 may be formed of one selected from the group consisting of Mo, Al, Cr, Au, Ti, Ni, Nd, and Cu, and an alloy thereof.

The first passivation layer 140 may be formed on the source electrode 135 and the drain electrode 137, and may be SiOx, SiNx, or a multilayer thereof. However, the first passivation layer 140 is not limited thereto.

The color filter 150 is formed in a red sub-pixel area, a blue sub-pixel area, and a green sub-pixel area, on the first passivation layer 140. The color filter 150 converts white light, emitted from an OLED, into red, blue, and green light.

The second passivation layer 160 may be formed on the color filter 150, and may be acryl-based resin, polyimide resin, SiOx, SiNx, or a multilayer thereof. However, the second passivation layer 160 is not limited thereto.

A light compensation layer (not shown) may be formed on the second passivation layer 160. The light compensation layer may be formed of SiOx or SiNx, or in a multilayer thereof, for enhancing the color viewing angle characteristic of the organic light emitting display device.

The anode electrode 170 may be formed on the second passivation layer 160, and formed of transparent indium tin oxide (ITO) or indium zinc oxide (IZO). However, the anode electrode 170 is not limited thereto. The anode electrode 170 is electrically connected to the source electrode 135. To this end, a contact hole is formed in a certain region of the first passivation layer 140, and a contact hole is formed in a certain region of the second passivation layer 160.

The bank layer 175 may be formed on the anode electrode 170, and include an organic material such as benzocyclobutene (BCB)-based resin, acryl-based resin, or polyimide resin. The bank layer 175 is formed on the anode electrode 170 to have a certain opening such that light emitted from the organic light emitting layer 180 is transmitted.

The organic light emitting layer 180 is formed on the bank layer 175, and emits white light. The organic light emitting layer 180 may include an EIL, an ETL, an EML, an HTL, and an HIL, and may be formed in a multilayer.

When a driving voltage is applied to the anode electrode 170 and the cathode electrode 190, a hole passing through the HTL and an electron passing through the ETL move to the EML to generate an exciton, and thus, the EML emits visible light.

The emitted white light passes through the color filter 150 and is externally transferred toward the substrate 101. At this point, light passing through a red color filter 151 is converted into red light, light passing through a blue color filter 155 is converted into blue light, and light passing through a green color filter 153 is converted into green light.

The cathode electrode 190 may be formed on the organic light emitting layer 180, and may use a metal material such as Al, Ca, or Mg, or a transparent material such as ITO or IZO.

The organic light emitting display device of FIG. 6 relates to an example of a bottom-emission type, and the present invention may be applied to various examples of the bottom-emission type known to those skilled in the art. Also, the present invention may be applied to a top-emission type, in addition to the bottom-emission type.

Figure 7:
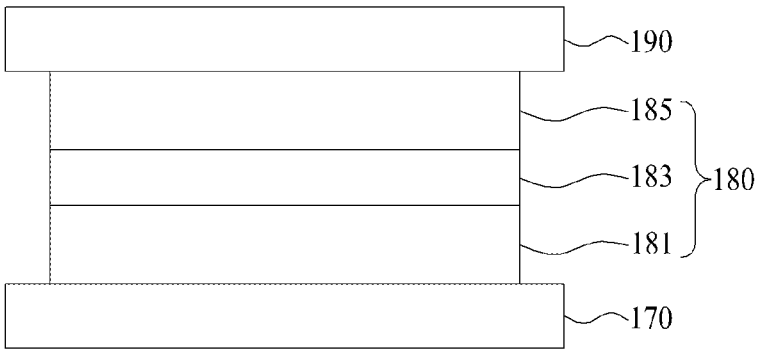
FIG. 7 is a view illustrating a sectional surface of an organic light emitting display device according to another embodiment of the present invention.

FIG. 7 is a view illustrating a sectional surface of an organic light emitting display device according to another embodiment of the present invention.

As seen in FIG. 7, an organic light emitting layer 180 is formed between an anode electrode 170 and a cathode electrode 190, and includes a first stack 181, a charge generation layer (CGL) 183, and a second stack 185.

The first stack 181 may include an EIL, an ETL, a first EML, an HTL, and an HIL. The first EML may be formed as an emission layer emitting blue light.

Then second stack 185 may include an EIL, an ETL, a second EML, an HTL, and an HIL. The second EML may be formed as an emission layer emitting yellow-green light.

The CGL 183 is formed between the first and second stacks 181 and 185, and formed of a material having low optical loss characteristic and low electrical loss characteristic.

The organic light emitting layer 180 having the above-described structure emits white light by combination of the first EML (emitting blue light) and the second EML (emitting yellow-green light). Therefore, the organic light emitting layer 180 having the structure of FIG. 7 may be easily applied to the organic light emitting display device of FIG. 6.

In addition to the organic light emitting layer 180 including the two EMLs and emitting white light, an organic light emitting layer including three or more EMLs and emitting white light may be applied to the organic light emitting display device of FIG. 6.

Hereinafter, experiment data for determining area ratios by sub-pixel will be described in detail with reference to graphs.

Comparative Example 1

Figure 8:
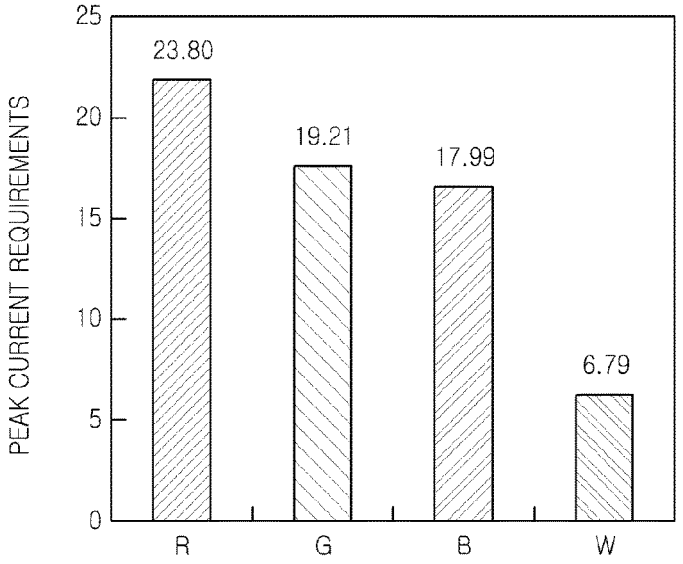
FIGS. 8 to 10 are graphs showing peak-luminance current density requirements, peak-luminance design achievement degree, and color-coordinate life when an area ratio of a red sub-pixel, a green sub-pixel, a blue sub-pixel, and a white sub-pixel is 28.5:28.5:45:34.2.
Figure 9:
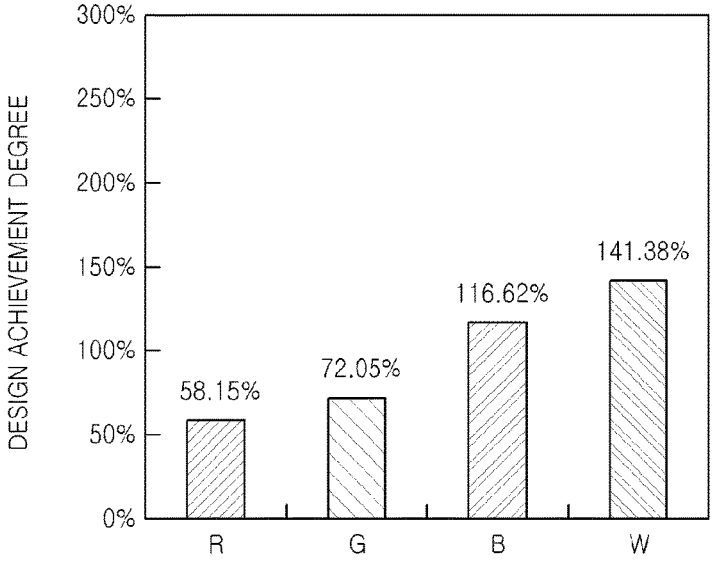
Figure 10:
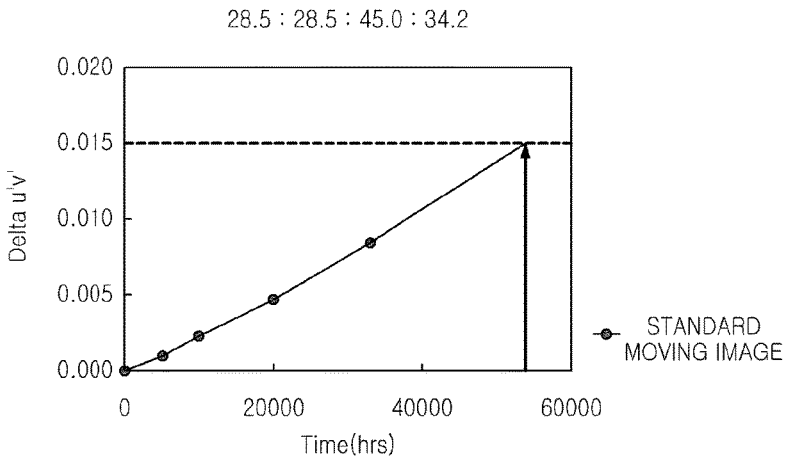

FIGS. 8 to 10 are graphs showing peak-luminance current density requirements, peak-luminance design achievement degree, and color-coordinate life when an area ratio of a red sub-pixel, a green sub-pixel, a blue sub-pixel, and a white sub-pixel is 28.5:28.5:45:34.2.

That is, the comparative example 1 is a case in which the area of the blue sub-pixel is greatest formed. As seen in FIG. 10, since the area of the blue sub-pixel which is frequently used in realizing a standard moving image is greatest formed, it can be seen that the color-coordinate life is good.

However, the comparative example 1 does not consider a peak-luminance current density, and thus, as seen in FIG. 9, it can be seen that a peak-luminance design achievement degree of the red sub-pixel having the highest peak-luminance current density is 58.15% and is very low. That is, it is very difficult to achieve the peak luminance.

Comparative Example 2

Figure 11:
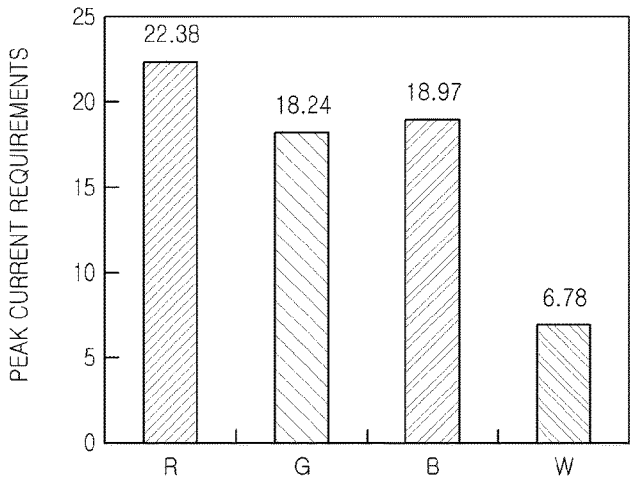
FIGS. 11 to 13 are graphs showing peak-luminance current density requirements, peak-luminance design achievement degree, and color-coordinate life when an area ratio of a red sub-pixel, a green sub-pixel, a blue sub-pixel, and a white sub-pixel is 35:35:35:35.
Figure 12:
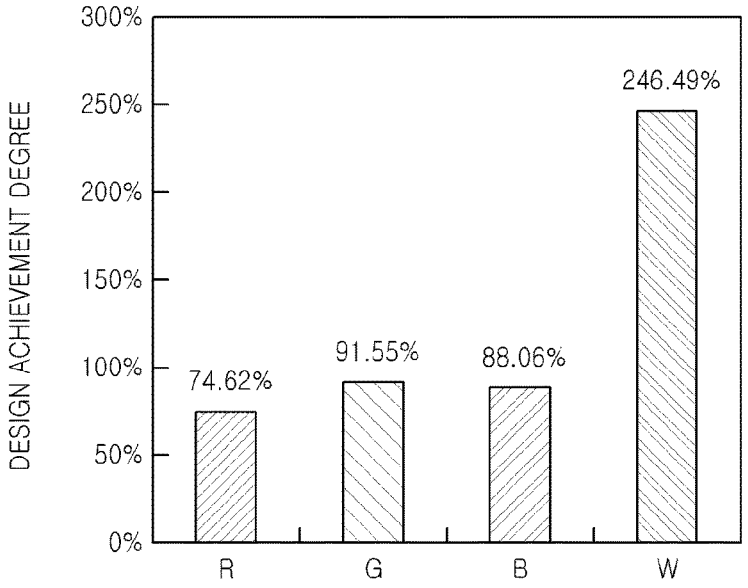
Figure 13:
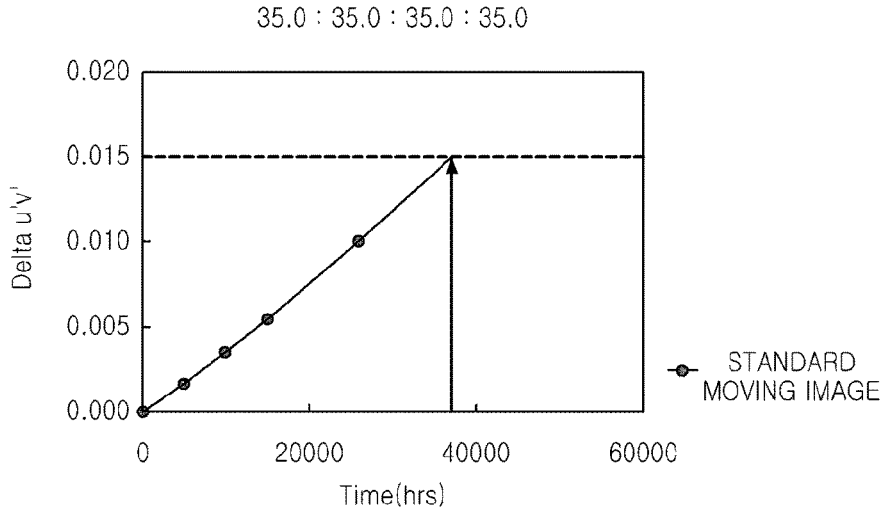

FIGS. 11 to 13 are graphs showing peak-luminance current density requirements, peak-luminance design achievement degree, and color-coordinate life when an area ratio of a red sub-pixel, a green sub-pixel, a blue sub-pixel, and a white sub-pixel is 35:35:35:35.

That is, the comparative example 2 is a case in which the areas of all sub-pixels are formed equally. As seen in FIG. 13, it can be seen that the color-coordinate life is slightly shortened compared to the comparative example 1.

Moreover, as seen in FIG. 12, in the peak-luminance design achievement degree, it can be seen that an achievement ratio of the white sub-pixel is excessively high.

Comparative Example 3

Figure 14:
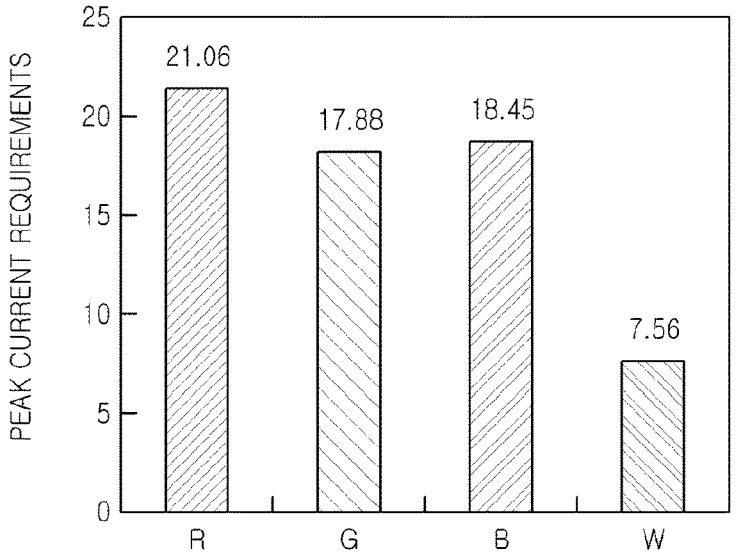
FIGS. 14 to 16 are graphs showing peak-luminance current density requirements, peak-luminance design achievement degree, and color-coordinate life when an area ratio of a red sub-pixel, a green sub-pixel, a blue sub-pixel, and a white sub-pixel is 45.5:38.5:39.8:16.3.
Figure 15:
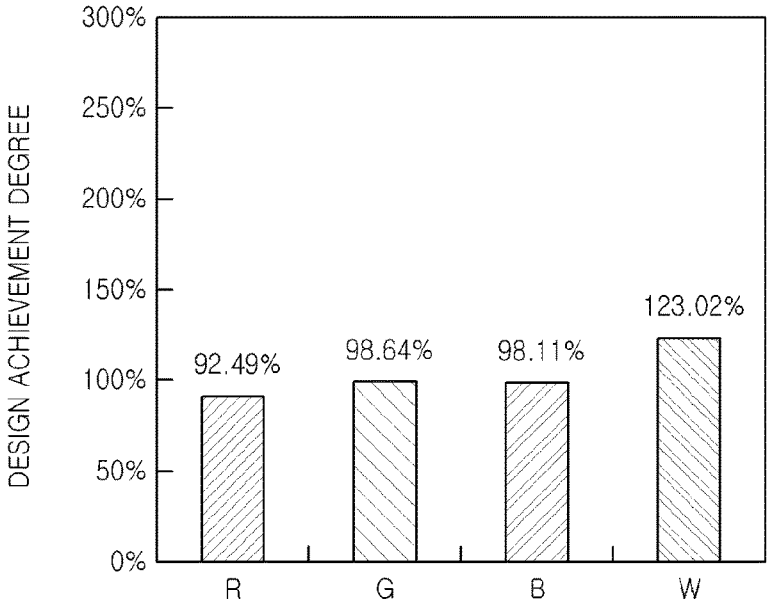
Figure 16:
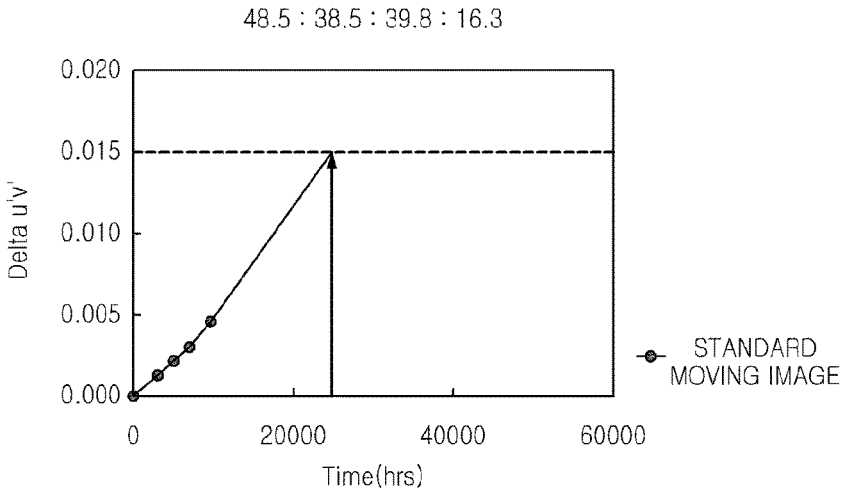

FIGS. 14 to 16 are graphs showing peak-luminance current density requirements, peak-luminance design achievement degree, and color-coordinate life when an area ratio of a red sub-pixel, a green sub-pixel, a blue sub-pixel, and a white sub-pixel is 45.5:38.5:39.8:16.3.

The comparative example 3 is a case in which the red sub-pixel is formed to have the greatest area, the blue sub-pixel is formed to have the second greatest area, the green sub-pixel is formed to have the third greatest area, and the white sub-pixel is formed to have the least area.

As seen in FIG. 15, it can be seen that the sub-pixels are formed to have an overall equal peak-luminance design achievement degree, and thus, the peak luminance is easily achieved.

However, as seen in FIG. 16, it can be seen that the color-coordinate life is relatively shortened compared to the comparative examples 1 and 2. Also, as seen in FIG. 20, it can be seen that an average current density difference between the green sub-pixel and the white sub-pixel is large. That is, the average current density of the white sub-pixel exceeds 6 times that of the green sub-pixel.

FIG. 20 is a graph showing a comparison result of current densities based on an area ratio of sub-pixels which are described in FIGS. 8 to 19.

Example 1

Figure 17:
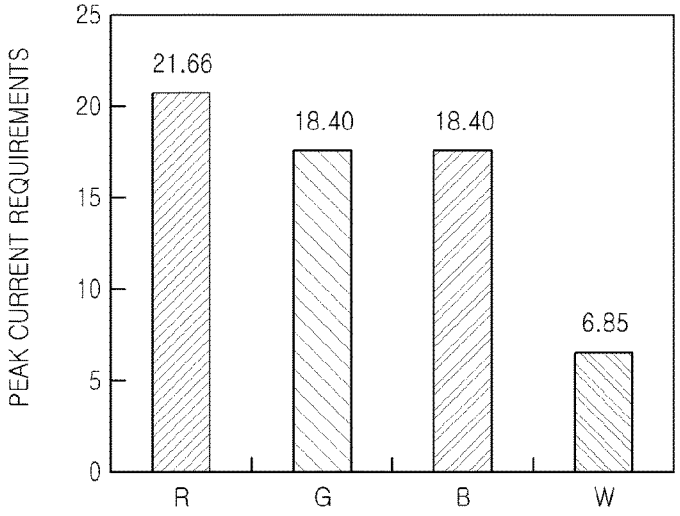
FIGS. 17 to 19 are graphs showing peak-luminance current density requirements, peak-luminance design achievement degree, and color-coordinate life when an area ratio of a red sub-pixel, a green sub-pixel, a blue sub-pixel, and a white sub-pixel is 45:35:35:30.
Figure 18:
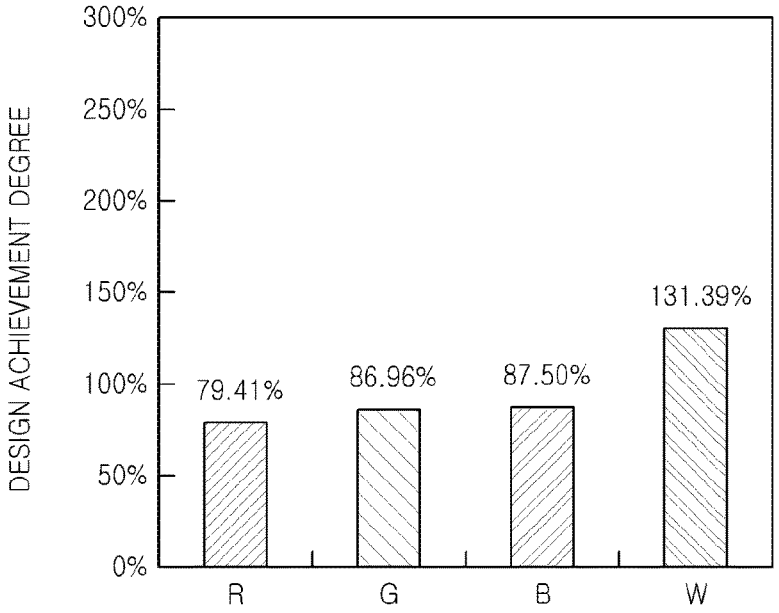
Figure 19:
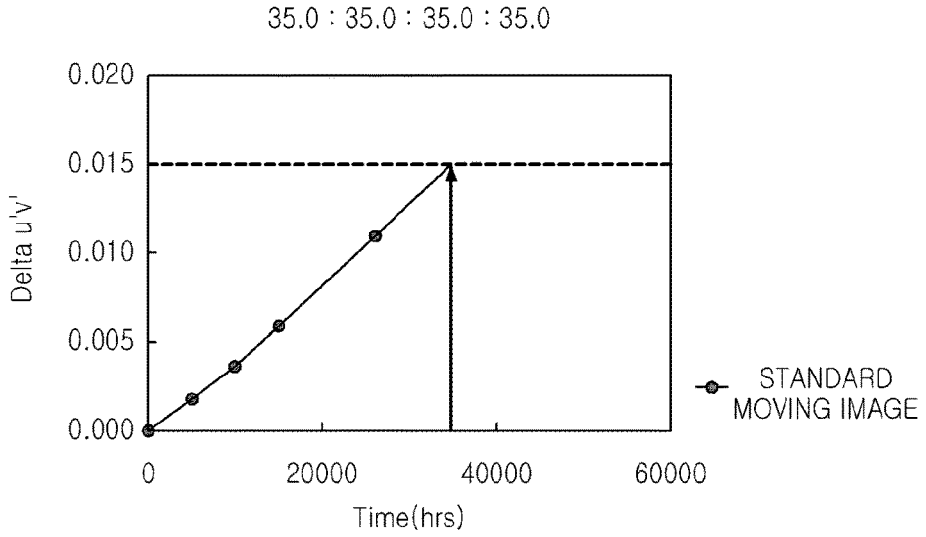

FIGS. 17 to 19 are graphs showing peak-luminance current density requirements, peak-luminance design achievement degree, and color-coordinate life when an area ratio of a red sub-pixel, a green sub-pixel, a blue sub-pixel, and a white sub-pixel is 45:35:35:30.

The example 1 is a case in which the red sub-pixel is formed to have the greatest area, the blue and green sub-pixels are formed to have the second greatest area, and the white sub-pixel is formed to have the least white sub-pixel.

As seen in FIG. 18, the example 1 shows an achievement ratio lower than the peak-luminance design achievement degree of the comparative example 3, but, as seen in FIG. 19, it can be seen that the color-coordinate life is enhanced compared to the comparative example 3. Also, as seen in FIG. 20, it can be seen that the average current density deviation of each sub-pixel is reduced compared to the comparative example 3.

As described above, the present invention fundamentally uses a white sub-pixel having good light emission efficiency, in addition to red, green, and blue sub-pixels, thus improving the luminance characteristic of the organic light emitting display device.

Especially, the present invention sets the size of each sub-pixel in consideration of a peak-luminance current density and an average use current density, thus easily achieving the peak luminance and enhancing the color-coordinate life.

The present invention enhances the color-coordinate life, and thereby improves the image-sticking life, thus decreasing image sticking.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device, comprising: *a pixel including:* a *single* red sub-pixel [formed] on a substrate;

a *single* blue sub-pixel [formed] on the substrate;

a *single* green sub-pixel [formed] on the substrate; and a *single* white sub-pixel [formed] on the substrate,

*wherein the sub-pixels are arranged in the order of the red sub-pixel, the white sub-pixel, the green sub-pixel, and the blue sub-pixel in one direction, and* wherein, in the sub-pixels;

[a sub-pixel having a greatest area is one of] a sub-pixel having a highest peak-luminance current [density and a sub-pixel having a highest average use current density] *among the red, blue, green, and white sub-pixels has one of a largest area and a second largest area among the red, blue, green, and white sub-pixels, and has a larger area than at least one of the other three sub-pixels, and*

[a sub-pixel having a second greatest area is the other of the sub-pixel having the highest peak-luminance current density and the sub-pixel having the highest average use current density,]

the peak-luminance current [density] *for each sub-pixel* is a current [density] necessary for the sub-pixel [for realizing peak luminance that is predetermined maximum peak, and the average use current density is a current density that is averagely used with a use time of the sub-pixel] *to realize a predetermined maximum luminance value for the sub-pixel.*

2. The organic light emitting display device of claim 1, wherein, an area of the red sub-pixel is 1.25 to 1.5 times an area of the white sub-pixel;

an area of the blue sub-pixel is 1.25 or less times and exceeds 1.0 times an area of the white sub-pixel; and an area of the green sub-pixel is 1.25 or less times and exceeds 1.0 times an area of the white sub-pixel.

3. The organic light emitting display device of claim 1, wherein the sub-pixels have the same height[, and are arranged in the order of the red sub-pixel, the white sub-pixel, the green sub-pixel, and the blue sub-pixel].

[4. A method of manufacturing an organic light emitting display device, comprising:

forming a TFT array;

forming a 2-peak white OLED emitting white light by combination of light emitted from first and second emission layers (EMLs), on the TFT array; and forming a red sub-pixel, a blue sub-pixel, a green sub-pixel and a white sub-pixel, wherein, in the forming the sub-pixels:

one of a sub-pixel having a highest peak-luminance current density and a sub-pixel having a highest average use current density have a greatest area, and the other of the sub-pixel having the highest peak-luminance current density and the sub-pixel having the highest average use current density have a second greatest area.]

5. The method of claim [4] *22*, wherein the sub-pixel having the highest *determined* peak-luminance current density is the red sub-pixel.

[6. The method of claim 4, wherein, in the forming the sub-pixels:

an average use current density of the sub-pixel having the highest average use current density is 6 or less times an average use current density of the sub-pixel having the lowest average use current density, a peak-luminance design achievement degree of a sub-pixel having a highest peak-luminance design achievement degree is 2 or less times a peak-luminance design achievement degree of a sub-pixel having the lowest peak-luminance design achievement degree, and a color-coordinate life of the organic light emitting display device is 20,000 hours or more, the color-coordinate life being a time taken until reaching a predetermined color-coordinate threshold change amount, the predetermined color-coordinate threshold change amount calculated by a color-coordinate change amount being 0.015, the color-coordinate change amount being expressed as $[u'_t-u'_0)^2+(v'_t-v'_0)^2]^{1/2}$, the color-coordinate change amount being a color-coordinate difference between initial color coordinates (u'0, v'0) and color coordinates (u't, v't) after a certain time "t" elapses.]

*7. The organic light emitting display device of claim 1, wherein a sub-pixel having a highest average use current has the other of the largest area and the second largest area, an average use current of each sub-pixel being a current of the sub-pixel averaged over a use time of the sub-pixel, and*

*wherein the sub-pixel having the highest average use current is the blue sub-pixel.*

*8. The organic light emitting display device of claim 7, wherein the blue sub-pixel has the second largest area, the second largest area being smaller than the largest area.*

*9. The organic light emitting display device of claim 1, wherein the organic light emitting display device has a spectrum characteristic in which intensity at a wavelength corresponding to a color of the sub-pixel having the highest peak-luminance current among red, green, and blue is lower than intensity at wavelengths respectively corresponding to the other two of red, green, and blue.*

*10. The organic light emitting display device of claim 1, the sub-pixel having the highest peak-luminance current is the red sub-pixel, and*

*wherein the red sub-pixel has the larger area than each of the green, blue, and white sub-pixels.*

*11. An organic light emitting display device, comprising:*

*a pixel including a red sub-pixel, a blue sub-pixel, a green sub-pixel, and a white sub-pixel arranged consecutively in one direction on a substrate;*

*wherein, among the red, blue, green, and white sub-pixels, the red sub-pixel has one of a largest area and a second largest area, and has a larger area than at least one of the blue, green, and white sub-pixels.*

12. The organic light emitting display device of claim 11, wherein, among the red, blue, green, and white sub-pixels, the blue sub-pixel has the other of the largest area and the second largest area.

13. The organic light emitting display device of claim 12, wherein the second largest area is larger than an area of the white sub-pixel, and wherein the white sub-pixel has a smallest area among the red, blue, green, and white sub-pixels.

14. The organic light emitting display device of claim 11, wherein:

an area of the red sub-pixel is 1.25 to 1.5 times an area of the white sub-pixel;

the area of the blue sub-pixel is 1.0 to 1.25 times the area of the white sub-pixel; and an area of the green sub-pixel is 1.0 to 1.25 times the area of the white sub-pixel.

15. The organic light emitting display device of claim 11, wherein the organic light emitting display device has a spectrum characteristic in which intensity at a wavelength corresponding to red is lower than intensity at wavelengths respectively corresponding to green and blue.

16. An organic light emitting display device, comprising:

a pixel including:

a single red sub-pixel on a substrate;

a single blue sub-pixel on the substrate;

a single green sub-pixel on the substrate; and a single white sub-pixel on the substrate, wherein the sub-pixels are arranged in the order of the red sub-pixel, the white sub-pixel, the green sub-pixel, and the blue sub-pixel in one direction, and wherein the organic light emitting display device has a spectrum characteristic with respective intensity at wavelengths respectively corresponding to red, green, and blue, and wherein a sub-pixel having a color with a lowest corresponding intensity in the spectrum characteristic among red, blue, and green has a largest area among the red, blue, green, and white sub-pixels, and has a larger area than at least one of the other three sub-pixels.

17. The organic light emitting display device of claim 16, wherein the sub-pixel having the color with the lowest corresponding intensity in the spectrum characteristic among red, blue, and green is red, and the red sub-pixel has the largest area among the red, blue, green, and white sub-pixels.

18. The organic light emitting display device of claim 16, wherein the sub-pixel having the color with the lowest corresponding intensity in the spectrum characteristic among red, blue, and green has a highest peak-luminance current among the red, blue, green, and white sub-pixels.

19. The organic light emitting display device of claim 16, wherein a sub-pixel having a highest average use current has a second largest area among the red, blue, green, and white sub-pixels, an average use current of each sub-pixel being a current of the sub-pixel averaged over a use time of the sub-pixel.

20. The organic light emitting display device of claim 19, wherein the sub-pixel having the highest average use current is the blue sub-pixel, and the second largest area is smaller than the largest area.

21. The organic light emitting display device of claim 16, wherein the white sub-pixel has a smallest area among the red, blue, green, and white sub-pixels.

22. A method of fabricating an organic light emitting display device having a substrate, the method comprising:

determining a peak-luminance current density for each of a red sub-pixel, a blue sub-pixel, a green sub-pixel, and a white sub-pixel having a same area;

determining an average use current density for each of the red, blue, green, and white sub-pixels having the same area;

determining a primary size of each of the red, blue, green, and white sub-pixels based on the determined peak luminance current density;

determining a secondary size of each of the red, blue, green, and white sub-pixels based on the determined average use current density;

forming on the substrate a red sub-pixel, a blue sub-pixel, a green sub-pixel, and a white sub-pixel, each having a respective size determined based on the primary size and the secondary size, wherein the forming of the red, blue, green, and white sub-pixels includes:

respectively setting the size of each of the red, blue, green, and white sub-pixels based on the primary size and the secondary size; and forming each of the red, blue, green, and white sub-pixels on the substrate based on the respectively set size, and wherein:

a sub-pixel having a highest determined peak-luminance current density is formed to have a largest size among the red, blue, green, and white sub-pixels, and to have a greater size than at least one of the other three sub-pixel, an average use current density of the sub-pixel having the highest determined average use current density is 6 or less times an average use current density of the sub-pixel having the lowest determined average use current density, a peak-luminance design achievement degree of a sub-pixel having a highest peak-luminance design achievement degree is 2 or less times a peak-luminance design achievement degree of a sub-pixel having the lowest peak-luminance design achievement degree, and a color-coordinate life of the organic light emitting display device is 20,000 hours or more, the color-coordinate life being a time taken until reaching a predetermined color-coordinate threshold change amount, the predetermined color-coordinate threshold change amount calculated by a color-coordinate change amount being 0.015, the color-coordinate change amount being expressed as $[u'_t-u'_0)^2+(v'_t-v'_0)^2]^{1/2}$, the color-coordinate change amount being a color-coordinate difference between initial color coordinates (u'0, v'0) and color coordinates (u't, v't) after a certain time "t" elapses.

23. The method of claim 22, wherein a sub-pixel having a highest determined average use current density is formed to have a second largest area smaller than the largest area, and wherein the sub-pixel having the highest determined average use current density is the blue sub-pixel.

* * * * *